US012685122B2

(12) United States Patent
Hsiao et al.

(10) Patent No.: US 12,685,122 B2
(45) Date of Patent: Jul. 14, 2026

(54) VIA STRUCTURE AND METHOD FOR FORMING THE SAME

(71) Applicant: Taiwan Semiconductor Manufacturing Company, Ltd., Hsin-Chu (TW)

(72) Inventors: Tsung-Chieh Hsiao, Hsinchu (TW); Liang-Wei Wang, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 537 days.

(21) Appl. No.: 18/172,420

(22) Filed: Feb. 22, 2023

(65) Prior Publication Data

US 2024/0145344 A1     May 2, 2024

Related U.S. Application Data

(60) Provisional application No. 63/381,417, filed on Oct. 28, 2022.

(51) Int. Cl.
| | |
|---|---|
| *H10W 20/20* | (2026.01) |
| *H10W 20/00* | (2026.01) |
| *H10W 90/00* | (2026.01) |
| *H10W 90/20* | (2026.01) |

(52) U.S. Cl.
CPC ......... *H10W 20/20* (2026.01); *H10W 20/023* (2026.01); *H10W 20/056* (2026.01); *H10W 20/076* (2026.01); *H10W 90/00* (2026.01); *H10W 90/297* (2026.01)

(58) Field of Classification Search
CPC ................. H01L 23/481; H01L 21/486; H01L 21/76831; H01L 21/76877; H01L 21/76898; H10W 90/00; H10W 90/297; H10W 20/20; H10W 20/076; H10W 20/023; H10W 20/056
See application file for complete search history.

(56) References Cited

U.S. PATENT DOCUMENTS

| | | | |
|---|---|---|---|
| 6,429,118 B1 * | 8/2002 | Chen ................... | H01L 21/7684 257/E21.585 |
| 8,202,800 B2 | 6/2012 | Chen et al. | |
| 9,299,676 B2 | 3/2016 | Yu et al. | |
| 2003/0077897 A1 * | 4/2003 | Tsai ................. | H01L 21/76807 438/634 |

(Continued)

FOREIGN PATENT DOCUMENTS

| | | |
|---|---|---|
| TW | I737523 B | 8/2021 |
| TW | I778594 B | 9/2022 |

*Primary Examiner* — John M Parker
(74) *Attorney, Agent, or Firm* — HAYNES AND BOONE, LLP

(57) ABSTRACT

A via structure, a semiconductor structure, and methods for forming the via structure and the semiconductor structure are presented. A via structure includes a first conductive portion through an interconnect structure, a second conductive portion through a substrate and in contact with the first conductive portion, and a liner layer. The liner layer is between the first conductive portion and the interconnect structure, and between the second conductive portion and the substrate. The liner layer includes a portion extending parallel to a surface of the substrate.

20 Claims, 14 Drawing Sheets

(56) References Cited

U.S. PATENT DOCUMENTS

| 2011/0266691 A1* | 11/2011 | Lin | H01L 23/5226 |
| | | | 257/E27.111 |
| 2012/0083116 A1* | 4/2012 | Yang | H01L 23/53238 |
| | | | 438/653 |
| 2014/0008757 A1* | 1/2014 | Ramachandran | H01L 23/481 |
| | | | 438/424 |
| 2014/0264947 A1* | 9/2014 | Lin | H01L 21/768 |
| | | | 438/455 |
| 2015/0340285 A1* | 11/2015 | Enquist | H01L 25/50 |
| | | | 438/107 |
| 2018/0068984 A1* | 3/2018 | Beyne | H01L 21/76898 |
| 2020/0144158 A1* | 5/2020 | Seo | H01L 21/76871 |
| 2022/0084884 A1* | 3/2022 | Shih | H01L 23/481 |
| 2022/0139805 A1* | 5/2022 | Shih | H01L 24/83 |
| | | | 257/774 |
| 2022/0246497 A1* | 8/2022 | Fountain, Jr. | H01L 21/76898 |

* cited by examiner

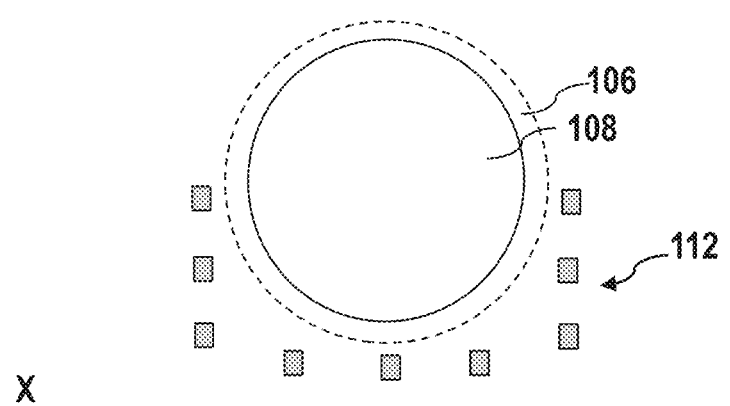
Fig. 1A
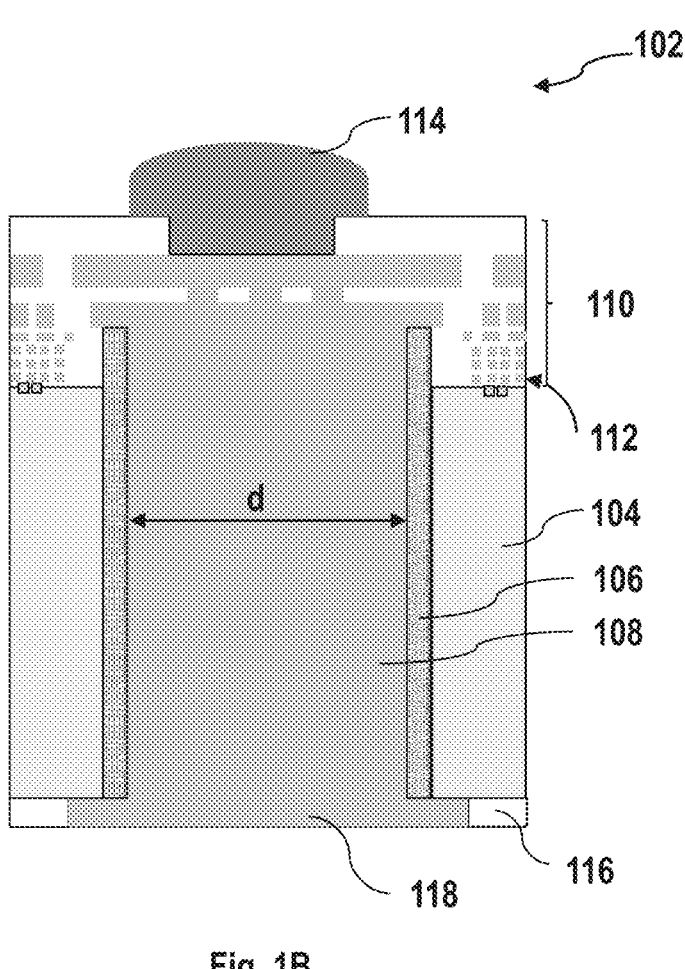
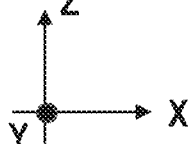
Fig. 1B

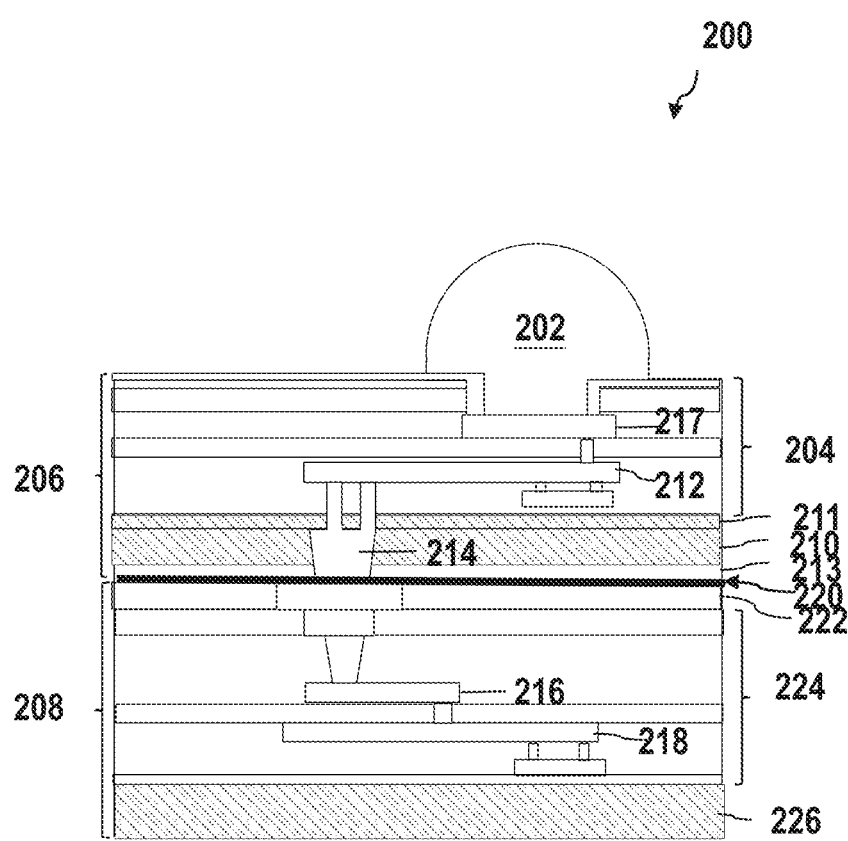
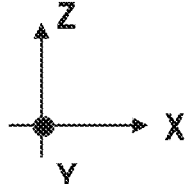
Fig. 2A

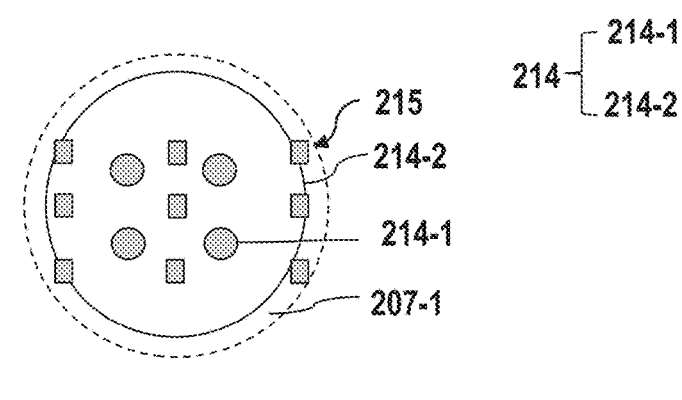
Fig. 2B
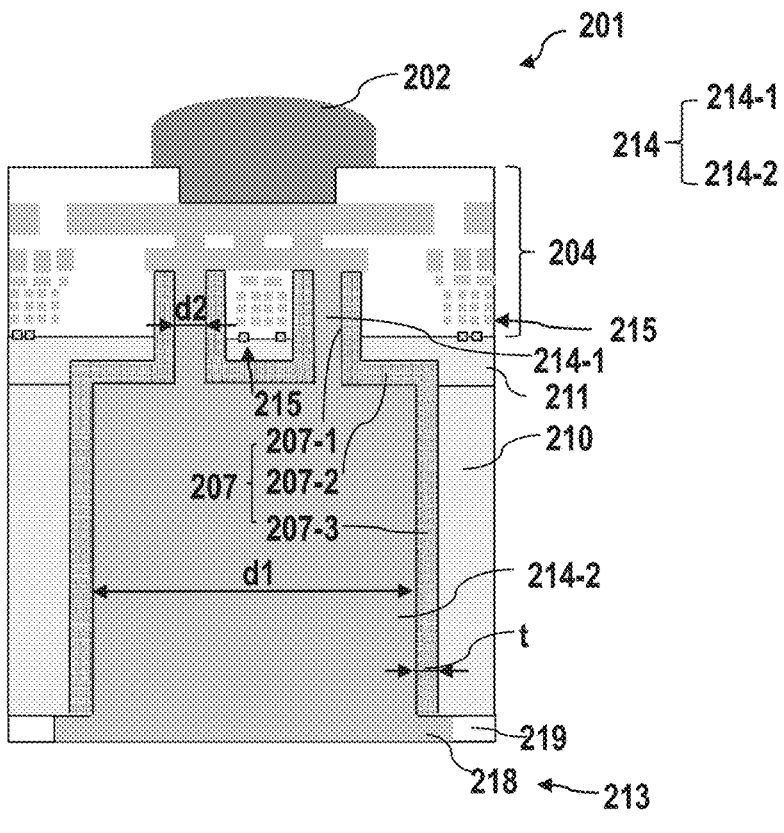
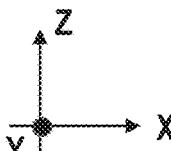
Fig. 2C

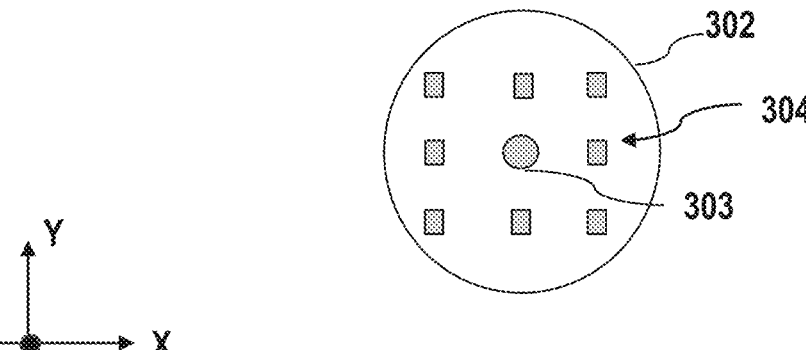
Fig. 3A
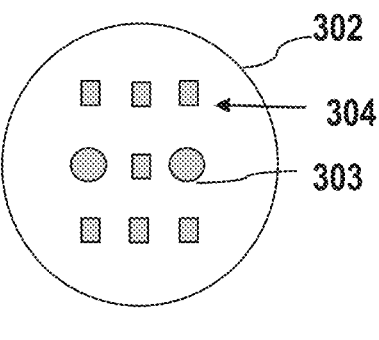
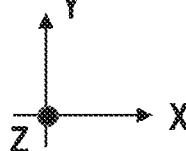
Fig. 3B

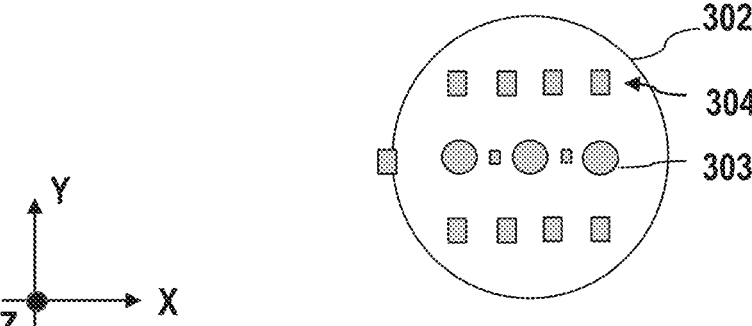
Fig. 3C
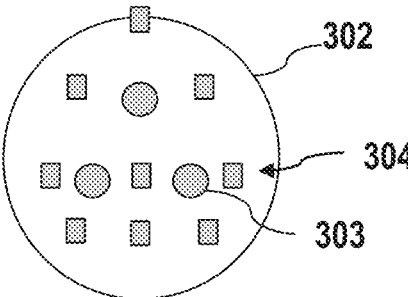
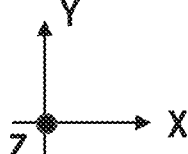
Fig. 3D

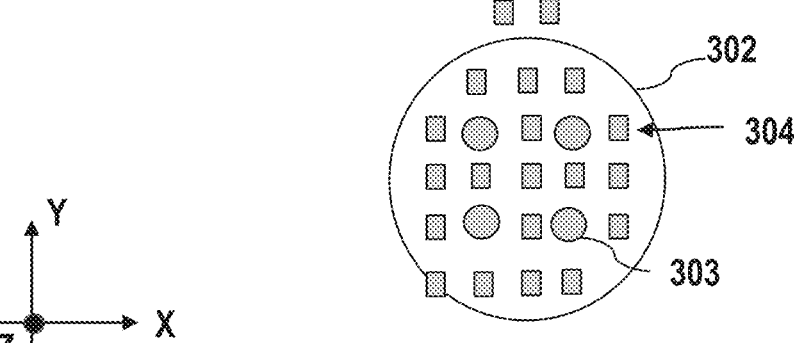
Fig. 3E
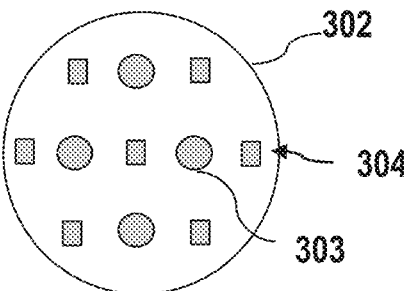
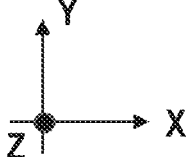
Fig. 3F

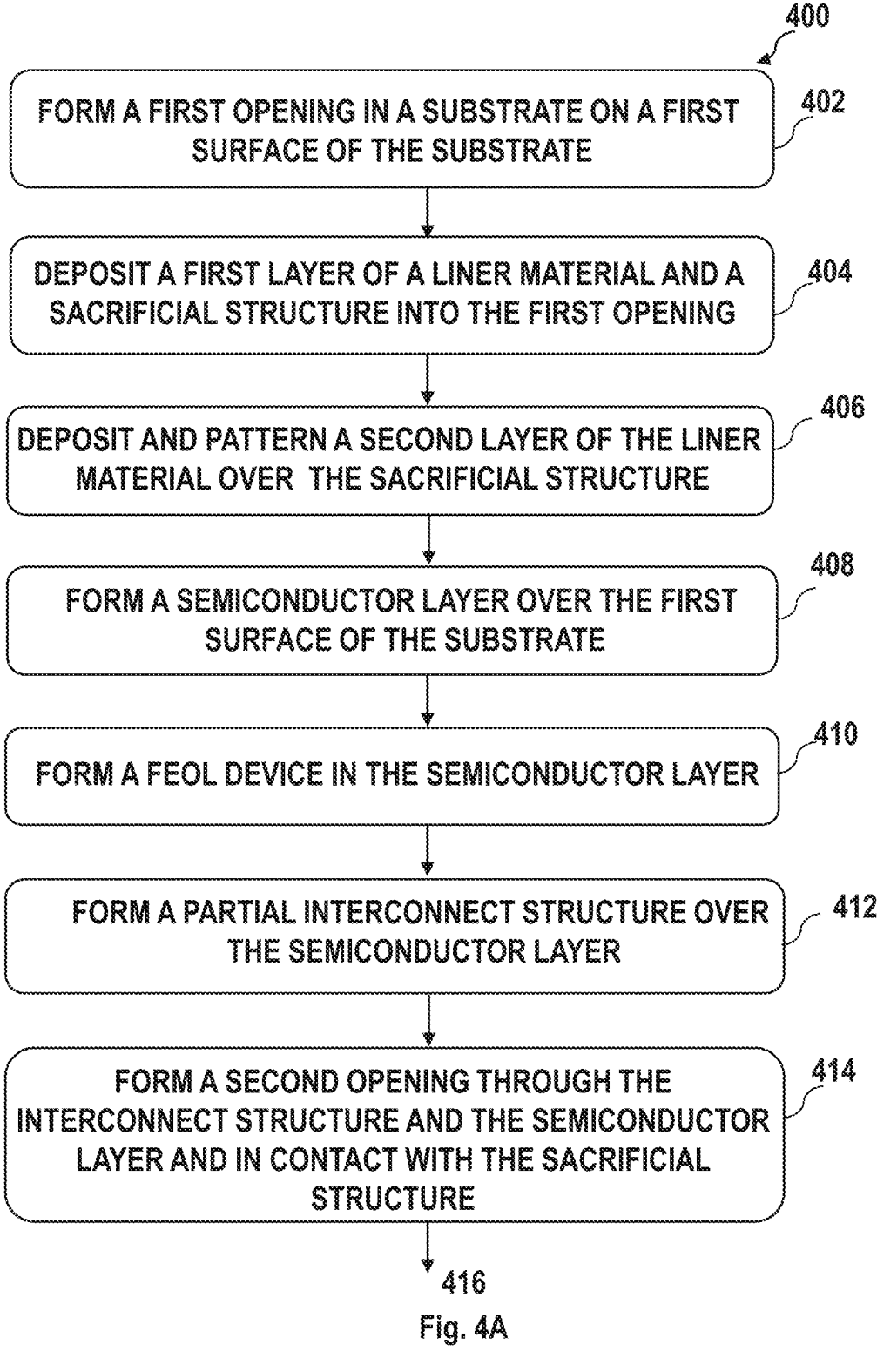

400

FORM A FIRST OPENING IN A SUBSTRATE ON A FIRST SURFACE OF THE SUBSTRATE — 402

DEPOSIT A FIRST LAYER OF A LINER MATERIAL AND A SACRIFICIAL STRUCTURE INTO THE FIRST OPENING — 404

DEPOSIT AND PATTERN A SECOND LAYER OF THE LINER MATERIAL OVER THE SACRIFICIAL STRUCTURE — 406

FORM A SEMICONDUCTOR LAYER OVER THE FIRST SURFACE OF THE SUBSTRATE — 408

FORM A FEOL DEVICE IN THE SEMICONDUCTOR LAYER — 410

FORM A PARTIAL INTERCONNECT STRUCTURE OVER THE SEMICONDUCTOR LAYER — 412

FORM A SECOND OPENING THROUGH THE INTERCONNECT STRUCTURE AND THE SEMICONDUCTOR LAYER AND IN CONTACT WITH THE SACRIFICIAL STRUCTURE — 414

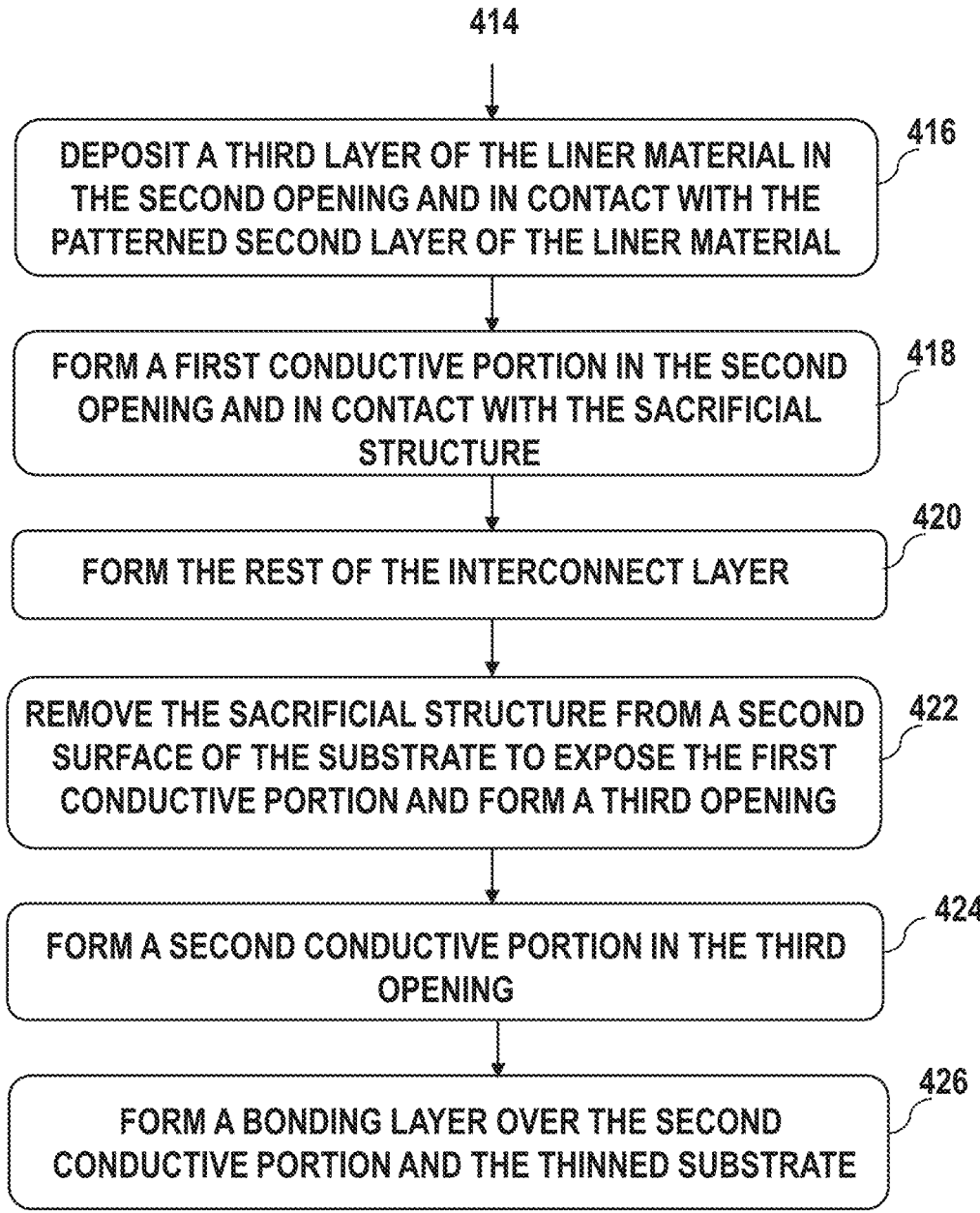

DEPOSIT A THIRD LAYER OF THE LINER MATERIAL IN THE SECOND OPENING AND IN CONTACT WITH THE PATTERNED SECOND LAYER OF THE LINER MATERIAL — 416

FORM A FIRST CONDUCTIVE PORTION IN THE SECOND OPENING AND IN CONTACT WITH THE SACRIFICIAL STRUCTURE — 418

FORM THE REST OF THE INTERCONNECT LAYER — 420

REMOVE THE SACRIFICIAL STRUCTURE FROM A SECOND SURFACE OF THE SUBSTRATE TO EXPOSE THE FIRST CONDUCTIVE PORTION AND FORM A THIRD OPENING — 422

FORM A SECOND CONDUCTIVE PORTION IN THE THIRD OPENING — 424

FORM A BONDING LAYER OVER THE SECOND CONDUCTIVE PORTION AND THE THINNED SUBSTRATE — 426

Fig. 4B

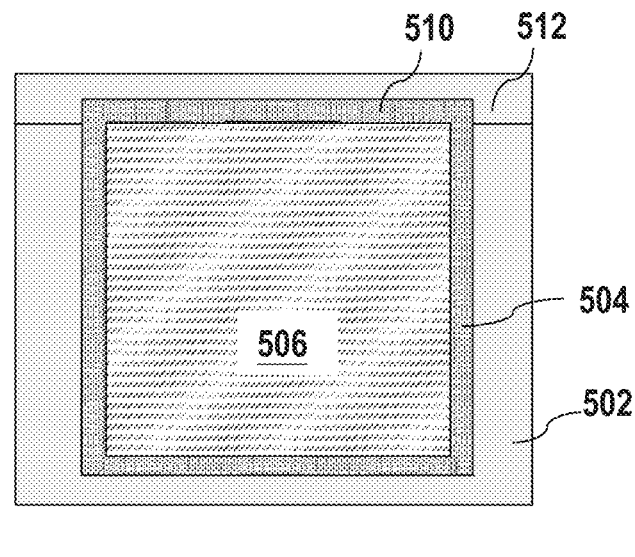
Fig. 5E
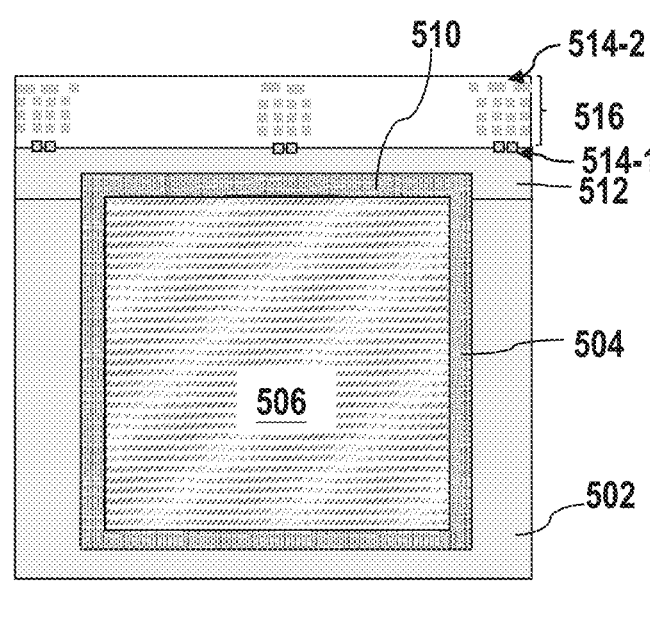
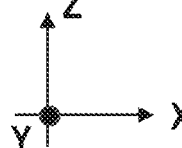
Fig. 5F

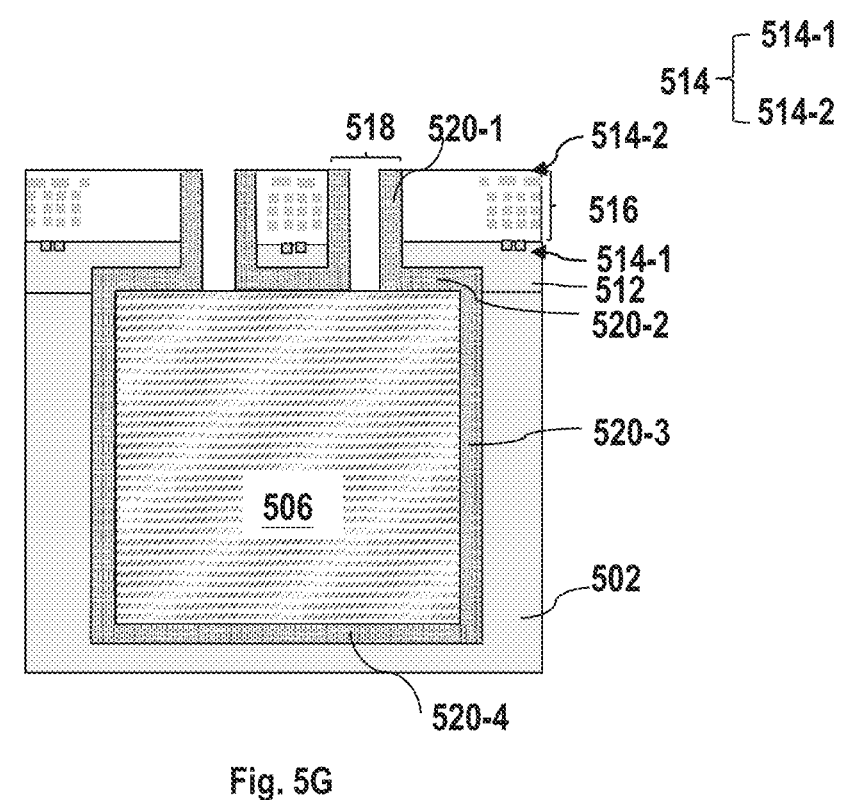
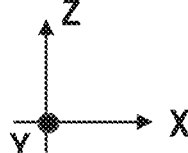
Fig. 5G
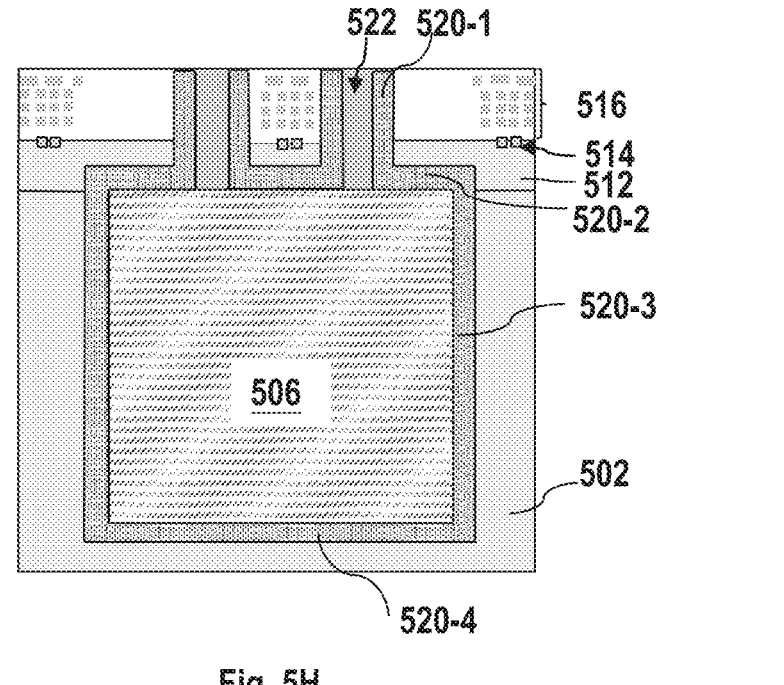
Fig. 5H

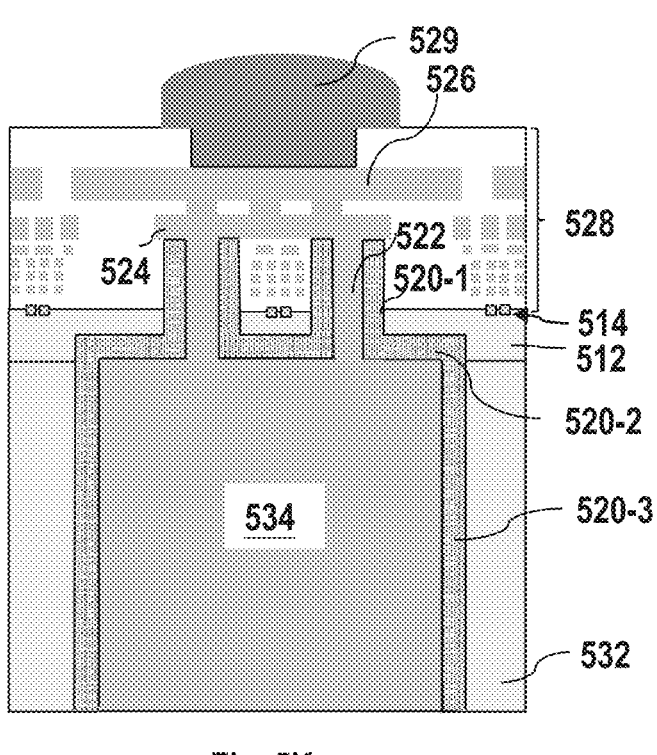
Fig. 5K
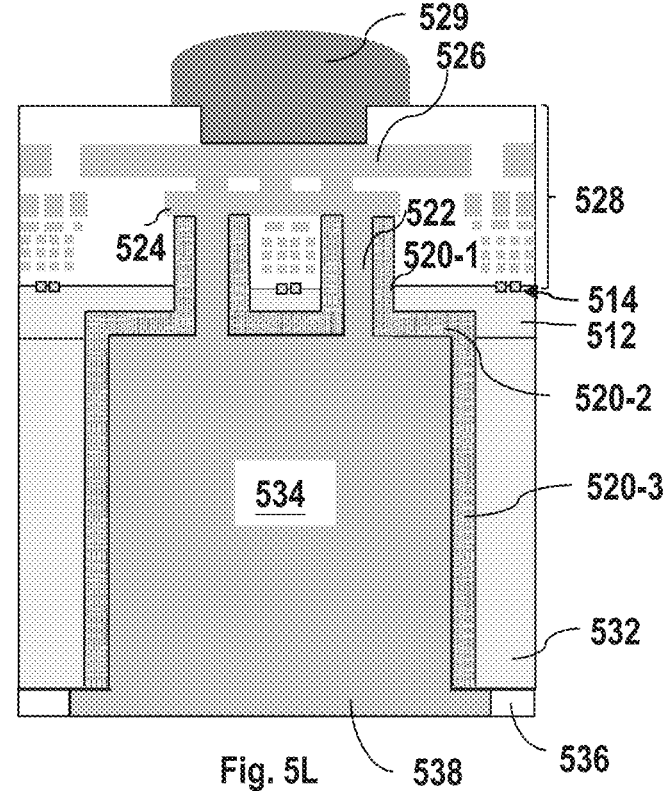
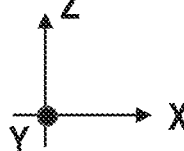
Fig. 5L

VIA STRUCTURE AND METHOD FOR FORMING THE SAME

CROSS REFERENCE(S)

The instant application is a nonprovisional of and claim priority under 35 U.S.C. 119 to U.S. provisional application No. 63/381,417, filed on Oct. 28, 2022, which is hereby expressly incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In semiconductor devices, a through-silicon via (TSV) is a vertical electrical connection that passes through a silicon wafer or die. TSVs can be used in the formation of three-dimensional (3D) semiconductor devices such as 3D packages and 3D integrated circuits (ICs). For example, in a 3D semiconductor device, two or more semiconductor structures (e.g., chips, dies) are stacked vertically. A TSV electrically connects the semiconductor structures and provides electrical connection between different parts in the semiconductor structures. TSVs can be an alternative to wire-bond and flip chips in the formation of a 3D semiconductor device. TSVs often do not require area in addition to the device area, and can reduce the lengths of electrical connections between different parts in the semiconductor structures.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1A illustrates a top view of part of a semiconductor structure having a TSV.

FIG. 1B illustrates a cross-sectional view of the part of the semiconductor structure shown in FIG. 1A.

FIG. 2A illustrates a cross-section view of an exemplary 3D semiconductor structure having an exemplary via structure, according to various aspects of the present disclosure.

FIG. 2B illustrates a top view of part of a semiconductor structure having an exemplary via structure, according to various aspects of the present disclosure.

FIG. 2C illustrates a cross-sectional view of the part of the semiconductor structure shown in FIG. 2B, according to various aspects of the present disclosure.

FIGS. 3A-3F each illustrates a top view of an exemplary semiconductor structure, according to various aspects of the present disclosure.

FIGS. 4A and 4B illustrate a flowchart of an exemplary method for forming a semiconductor structure, according to various aspects of the present disclosure.

FIGS. 5A-5L illustrate cross-sectional views of a semiconductor structure having a via structure during various stages of an exemplary fabrication process, according to various aspects of the present disclosure.

DETAILED DESCRIPTION

Figure 5A:
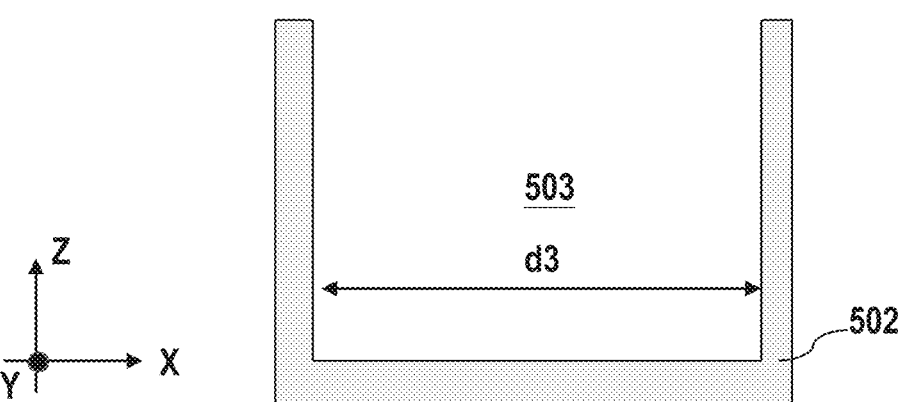

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In 3D semiconductor devices, TSVs are often used to provide electrical connections between two semiconductor structures stacked vertically. For example, in a 3D semiconductor device, TSVs can be used for connecting semiconductor structures with dies. A TSV is often disposed away from the devices and/or structures in the die. The TSV, having a substantially uniform diameter (e.g., critical dimension) from one end to the other, can be formed from filling an opening that extends in the semiconductor structures with a conductive material. However, existing TSVs can have some undesirable attributes.

For example, the dimension of an existing TSV is limited due to the consideration of dishing/loading effect, limiting further reduction of the resistance and the parasitic capacitance of the TSV. In the fabrication of a semiconductor structure, front-end-of-line (FEOL) device/structures (e.g., transistors) are often formed before a TSV is formed. An area (e.g., an "empty" area), for forming the TSV, is reserved in the semiconductor structure when the FEOL devices are being formed. To ensure sufficient space for forming the TSV, the reserved area often has a span (e.g., along a direction parallel to a surface of the substrate) up to several microns. The difference in the pattern densities between the FEOL device area and the reserved area (e.g., an "empty" area) can result in dishing/loading effects on the nearby devices (e.g., FEOL devices), causing nonuniformities (e.g., structural and/or functional nonuniformities) in the nearby devices. To reduce the dishing/loading effect, the dimension of the reserved area is often limited to be below a threshold value, which depends on design requirements. For example, the dimension of the reserved area can be no greater than about 6 μm, and the dimension of the TSV can be no greater than about 5 μm. Because the resistance of a TSV is inversely proportional to its dimension/diameter, such limitation can limit further reduction of the resistance of the TSV. For example, the resistance of the TSV can be undesirably high for some designs. Meanwhile, to maximize the size of the TSV in the opening, a thickness of the liner layer (e.g., including a dielectric material) between the TSV and the substrate may be sacrificed. Because the parasitic capacitance between the TSV and the substrate is inversely proportional to the thickness of the liner layer, such limitation can make it difficult to reduce the parasitic capacitance of the TSV, resulting the parasitic capacitance of the TSV to be undesirably high for some designs. The formed 3D semiconductor device can be susceptible to degraded efficiency and low speed. Also, the existing opening for forming the TSV can have a high aspect ratio, due to the required depth and limited dimension of the opening, leading to etching challenges and potential structural nonuniformities. Further, the conductive material (e.g., copper) of the TSV can impose high stress on nearby devices due to different coefficients of thermal expansion. The nearby devices may thus be susceptible to defects.

FIGS. 1A and 1B illustrate part of a semiconductor structure having an existing TSV. Specifically, FIG. 1B illustrates a cross-sectional view of part of the semiconductor structure having a TSV, and FIG. 1A is a top view of part of the semiconductor structure. For ease of illustration, only the arrangement of the TSV and nearby devices are shown in FIG. 1A.

As shown in FIG. 1B, a semiconductor structure 102 includes a metal feature 118, a dielectric layer 116, a substrate 104, an interconnect structure 110, and connecting structure 114. Metal feature 118 is disposed in dielectric layer 116, substrate 104 is disposed over metal feature 118 and dielectric layer 116, and interconnect structure 110 is disposed over substrate 104. Connecting structure 114 is disposed over and in contact with interconnect structure 110. Semiconductor structure 102 also includes a plurality of devices 112, such as transistors, fabricated on the substrate 104 at the FEOL level. The interconnect structure 110 functions to interconnect devices 112. Semiconductor structure 102 further includes a liner layer 106 and a TSV 108 each extending through substrate 104 and partially into the interconnect structure 110. Liner layer 106 surrounds and is in contact with TSV 108. Metal feature 118 is in contact with TSV 108. TSV 108 is electrically connected to connecting structure 114. Substrate 104 includes a semiconductor material such as silicon. Liner layer 106 and dielectric layer 116 may each include a suitable dielectric layer such as silicon oxide. Metal feature 118, TSV 108, and connecting structure 114 may each include a suitable conductive material, such as copper. The interconnect structure 110 includes a plurality of metal layers. Each of the metal layers include vias and metal lines disposed in an intermetal dielectric (IMD) layer. The vias and metal lines may include copper and the IMD layers may include silicon oxide or a suitable dielectric material.

As shown in FIG. 1B, TSV 108 may have a uniform critical dimension d (e.g., diameter d) in the x-direction. Diameter d is often in a range of about 3 μm to about 10 μm, e.g., between about 4 μm to about 6 μm. As stated above, the one-diameter structure of TSV 108 can cause issues in semiconductor structure 102. For example, to form TSV 108 and liner layer 106, devices 112 are first formed outside a reserved area defined in substrate 104 and interconnect structure 110. The reserved area often has a critical dimension, e.g., a span, of about 4 μm to about 10 μm, e.g., between about 5 μm to about 7 μm. An opening is then formed in the reserved area, and no devices 112 are formed in the reserved area. In the fabrication process, the difference in pattern densities between the reserved area and the device area can cause devices 112 to be susceptible to dishing/loading effect, resulting in unevenness in structure. For example, transistors can be susceptible to nonuniform gate heights, causing gate impedance to deviate from design. Also, the conductive material of TSV 108, e.g., copper, can cause high stress in nearby devices 112 due to a different coefficient of thermal expansion from surrounding structures.

The value range of diameter d limits further reduction of resistance of TSV 108 and the parasitic capacitance between TSV 108 and substrate 104. As stated before, diameter d is limited to a certain range in consideration of the dishing/loading effect. When the diameter is being limited, it becomes difficult to further reduce the resistance of TSV 108. Meanwhile, when the thickness of liner layer 106 is minimized to maximize the diameter of TSV 108, the parasitic capacitance between TSV 108 and substrate 104 may become undesirably high. Therefore, while existing TSVs are generally adequate for their intended purposes, further improvements may be needed.

The present disclosure provides a multi-level via structure and methods for forming the multi-level via structure. The multi-level via structure can reduce the dishing/loading effect while having desirably low resistance and parasitic capacitance. The multi-level via structure also reduces the aspect ratio of an opening during fabrication, as well as the stress between its conductive material and the surrounding structures/devices. Different from an existing TSV with a one-diameter structure, the via structure has a conductive portion of a smaller diameter in contact with another conductive portion of a larger diameter, forming a multi-level structure. For example, the multi-level via structure has one or more upper (e.g., first) conductive portions and a lower (e.g., second) conductive portion. The upper conductive portions each has a smaller diameter (e.g., critical dimension), and the lower conductive portion has a larger diameter (e.g., critical dimension). Devices (e.g., FEOL devices) may be formed around the upper conductive portions as well as over the lower conductive portion. In some embodiments, FEOL devices may be formed directly over the lower conductive portion of the via structure. As will be described further below, the multi-level via structure of the present disclosure has several advantages.

For example, the formation of the multi-level via structure does not result in an undesirably large difference in pattern densities between a reserved area and the nearby device area, and the dishing/loading effect on the nearby devices is reduced. Specifically, the formations of the upper conductive portion(s) and the lower conductive portion are separate, and the arrangement of the nearby devices is not limited by the size of the lower conductive portion. In some embodiments, a sacrificial structure is formed prior to the formation of the devices, e.g., the FEOL devices, as a placeholder of the lower conductive portion. A semiconductor layer is then formed over the sacrificial structure as the base structure for forming the FEOL devices. The FEOL devices can then be formed in/over the semiconductor layer outside any reserved area for the formation of the upper conductive portions. Middle-end-of-line (MEOL) structures and back-end-of-line (BEOL) structures can be formed over the FEOL devices and outside the reserved area. The reserved area can be over the sacrificial structure. The reserved areas are each smaller (e.g., much smaller in diameter) than the existing reserved area, and the dishing/loading effect on the nearby devices can be reduced. After the formation of upper conductive portion in each reserved area, the lower conductive portion can be formed by replacing the sacrificial structure with a conductive material. As described below in detail, the formation of the lower conductive portion has no or little impact on the FEOL devices. The impact, from the fabrication of the multi-level via structure, on the nearby devices (e.g., the FEOL devices, the MEOL structures, and the BEOL structures), can thus be minimized. FEOL devices, as well as the MEOL structures and the BEOL structures formed near the multi-level via structure, can thus have improved structural uniformity, and thus are less susceptible to defects and malfunctioning. The arrangement of the devices (e.g., FEOL devices, MEOL structures, and BEOL structures) near the multi-level via structure can thus be more flexible. Also, the upper conductive portion(s), each having a smaller diameter, can cause less stress to the nearby devices (e.g., FEOL devices, MEOL structures, and BEOL structures), compared to existing TSVs.

Further, the multi-level via structure also has desirably low resistance and lower parasitic capacitance, compared to existing TSVs. Specifically, the multi-level via structure can have a plurality of upper conductive portions that are connected in parallel, and a lower conductive portion having a diameter larger than that of an existing TSV. The parallel connection of the upper conductive portions can minimize the resistance of the upper conductive portions, and thus reducing the overall resistance of the multi-level via structure. Meanwhile, because the lower conductive portion is disposed entirely below the FEOL devices without affecting the patterning of the FEOL devices, the diameter of the lower conductive portion is thus not limited by the arrangement of the FEOL devices. The diameter of the lower conductive portion can thus be flexibly designed, e.g., to be greater, to further reduce the overall resistance of the multi-level via structure. That is, the opening for forming the lower conductive portion can have a larger diameter accordingly, and the liner layer can be of a satisfactory thickness. A thicker liner layer can reduce the parasitic capacitance between the multi-level via structure and the substrate, improving the speed of the semiconductor structure.

Moreover, as described above, the formation of a multi-level via structure includes separately forming upper conductive portion(s) and the lower conductive portion, and the depth of the opening for forming each conductive portion can thus be reduced. This can effectively reduce the aspect ratio of the openings. The fabrication (e.g., the etching of the openings) of the multi-level via structure can be easier compared to existing TSVs. In some embodiments, the diameters of the upper conductive portion(s), the diameters of the lower conductive portion, and the number of the upper conductive portion(s), can be flexibly designed to meet various design and fabrication requirements on resistance, parasitic capacitance, stress, and aspect ratios.

In some embodiments, the lower conductive portion of a multi-level via structure extends vertically through the substrate, and the upper conductive portions extend vertically through an interconnect structure and the semiconductor layer disposed over the substrate. The upper conductive portions are in contact with the lower conductive portion. In some embodiments, the projections of the upper conductive portions are completely within the projection of the lower conductive portion on a plane parallel to the surface of the substrate. In some embodiments, the diameter of an upper conductive portion is in a range of about 50 nm to about 6 μm, and the diameter of the lower conductive portion is in a range of about 1 μm to about 100 μm. The liner layer around the multi-level via structure may include a portion extending in parallel with a surface of the substrate. For example, the portion of the liner layer may be over the top surface (e.g., a flat top surface) of the lower conductive portion. The liner layer extending along the side surface of the lower conductive portion can have a thickness in a range of about 0.1 μm to about 5 μm. FEOL devices, MEOL structures, and BEOL structures, such as transistors and/or interconnects, can be formed around the upper conductive portions or between upper conductive portions. In some embodiments, the projections of the transistors can be partially or fully overlapped with the projection of the lower conductive portion on a plane parallel to the surface of the substrate.

To form the multi-level via structure, an opening is first formed from a first surface in the substrate. A layer of the liner material is deposited over the surface of the opening. A sacrificial structure is formed to fill the opening, and another layer of the liner material is deposited and patterned to cover the sacrificial structure. A semiconductor layer is epitaxially deposited over the liner material and the first surface of the substrate, and an interconnect structure is further formed over the semiconductor layer. FEOL devices, MEOL structures, and BEOL structures, are formed in the semiconductor layer and the interconnect structure. One or more upper conductive portions can then be formed extending through the interconnect structure and semiconductor layer. The sacrificial structure is then removed from a second surface of the substrate, and the conductive material is deposited to fill the opening formed by the removal of the sacrificial structure. The lower conductive portion may be then formed, in contact with the upper conductive portions.

FIG. 2A illustrates a simplified cross-sectional view of a 3D semiconductor device 200, according to embodiments of the present disclosure. 3D semiconductor device 200 represents an example in which the disclosed multi-level via structure is employed. 3D semiconductor device 200 may include a first semiconductor structure 206 and a second semiconductor structure 208 bonded at a bonding interface 220. First semiconductor structure 206 may include a bonding layer 213, a substrate 210 (e.g., a carrier substrate) over bonding layer 213, a semiconductor layer 211 over substrate 210, an interconnect structure 204 over semiconductor layer 211, and a connecting structure 202 over interconnect structure 204. In some embodiments, first semiconductor structure 206 includes a die (e.g., a logic die, a system-on-chip (SOC) die, a memory die) having a plurality of devices, e.g., transistors and interconnects, in semiconductor layer 211 and interconnect structure 204. First semiconductor structure 206 may further include a via structure 214 (e.g., a multi-level via structure), extending through semiconductor layer 211 and substrate 210. An upper portion of the via structure 214 may extend into interconnect structure 204 and is electrically connected to connecting structure 202 through interconnects in interconnect structure 204. For example, first semiconductor structure 206 may include a metal layer 212 in contact with via structure 214, and a contact layer 217 in contact with connecting structure 202. Metal layer 212 and contact layer 217 may be electrically connected through interconnects in interconnect structure 204. It should be noted that, FIG. 2A is merely employed to illustrate a scenario in which a via structure, e.g., 214, is employed in 3D semiconductor device 200, and is not meant to limit the detailed structure of via structure 214. The example structure and materials of via structure 214 are described in detail in FIGS. 2B and 2C.

Second semiconductor structure 208 includes a substrate 226 (e.g., a carrier substrate), an interconnect layer 224 over substrate 226, and a bonding layer 222 over interconnect layer 224. In some embodiments, second semiconductor structure 208 includes another die (e.g., a logic die, a system-on-chip (SOC) die, a memory die) in/on substrate 226. Interconnect layer 224 may include interconnects electrically connected to substrate 226 and the metal features in bonding layer 222. For example, second semiconductor structure 208 may include a metal feature 218 electrically connected to substrate 226, and a contact layer 216 electrically connected to metal features in bonding layer 222. Metal feature 218 and contact layer 216 may be electrically connected through interconnects in interconnect layer 224. In some embodiments, metal features of bonding layers 213 and 222 are bonded together at bonding interface 220.

As shown in FIG. 2A, via structure 214 may include one or more upper conductive portions in contact with a lower conductive portion. The one or more upper conductive portions may extend in interconnect structure 204 and are electrically connected to (e.g., in contact with) interconnects (e.g., metal layer 212) in interconnect structure 204. The lower conductive portion may be in contact with the metal feature in bonding layer 213. Via structure 214 may thus provide electrical connection between first semiconductor structure 206 and second semiconductor structure 208.

FIG. 2B illustrates a top view of an exemplary via structure 214, and FIG. 2C illustrates a cross-sectional view of a semiconductor structure 201, according to some embodiments of the present disclosure. Semiconductor structure 201 is part of first semiconductor structure 206 and includes via structure 214. For ease of illustration, FIG. 2B also illustrates various FEOL devices, MEOL structures, and BEOL structures disposed near via structure 214. It should be noted that, although via structure 214 is illustrated in view of first semiconductor structure 206 and 3D semiconductor device 200, via structure 214 can also be used in other suitable structures/devices to provide electrical connection in a single semiconductor structure or between semiconductor structures.

As shown in FIG. 2C, semiconductor structure 201 includes bonding layer 213, substrate 210 over bonding layer 213, semiconductor layer 211 over substrate 210, interconnect structure 204 over semiconductor layer 211, and connecting structure 202 over interconnect structure 204. Bonding layer 213 may include a dielectric layer 219 and a metal feature 218 in dielectric layer 219. Interconnect structure 204 may include various MEOL and BEOL devices/structures such as source/drain electrodes and metallization layers (e.g., interconnects). Semiconductor layer 211 includes various FEOL devices such as transistors, capacitors, memory cells, etc. The BEOL structures, MEOL structures, and FEOL devices may form a die which can be a logic die, a SOC die, a memory die, or any combination. The die may include a plurality of devices 215 including but not limited to transistors, capacitors, memory cells, source/drain contacts, metallization layers, etc. Semiconductor structure 201 may also include via structure 214 and a liner layer 207 surrounding via structure 214. Via structure 214 may be conductively connected to metal feature 218 of bonding layer 213 and interconnects (e.g., metal layer 212 referring back to FIG. 2A) in interconnect structure 204.

As illustrated in FIGS. 2B and 2C, via structure 214 may include one or more upper conductive portions 214-1 and a lower conductive portion 214-2. The one or more upper conductive portions 214-1 and lower conductive portion 214-2 may each extend vertically, e.g., along the z-direction. Upper conductive portions 214-1 may each be in contact with lower conductive portion 214-2 on the upper surface of lower conductive portion 214-2. In some embodiments, the upper surface of lower conductive portion 214-2 may level with the interface between semiconductor layer 211 and substrate 210 (or may level with the upper surface of substrate 210). Via structure 214 may extend through substrate 210 and semiconductor layer 211, and may extend in interconnect structure 204. Specifically, upper conductive portions 214-1 may extend through semiconductor layer 211 and extend in interconnect structure 204, and lower conductive portion 214-2 may extend through substrate 210. In some embodiments, upper conductive portions 214-1 and lower conductive portion 214-2 each has a cylindrical shape. In some embodiments, upper conductive portions 214-1 each has a substantially flat upper surface and a substantially flat lower surface. In some embodiments, lower conductive portion 214-2 has a substantially flat upper surface and a substantially flat lower surface. The lower surface of lower conductive portion 214-2 may level with the lower surface of substrate 210. In some embodiments, the projection of each upper conductive portion 214-1 is within in the projection of lower conductive portion 214-2 on a plane parallel to a surface of substrate 210.

In some embodiments, a diameter d2 (e.g., critical dimension) of a single upper conductive portion 214-1 is in a range between about 50 nm and about 5 μm. For example, d2 may be in a range of about 50 nm to about 2.5 In some embodiments, a diameter d1 (e.g., critical dimension) of lower conductive portion 214-2 is in a range between about 1 μm and about 100 μm. For example, d1 may be greater than about 6 μm and less than about 50 μm. In various embodiments, diameters d1 and d2 are determined based on design requirements such as the designed resistance of via structure 214. For example, to minimize the resistance, d2 can be less than or equal to the critical dimension of an existing TSV (e.g., about 5 μm), and d1 can be greater than the critical dimension of the existing TSV. In some embodiments, a length of upper conductive portion 214-1 is in a range of about 0.1 μm to about 15 μm in the z-direction, and a length of lower conductive portion 214-2 is in a range of about 1 μm to about 200 μm in the z-direction.

In some embodiments, metal feature 218 covers the lower surface of lower conductive portion 214-2. For example, metal feature 218 may also be in contact with (e.g., cover) liner layer 207 in the x-direction. In some embodiments, upper conductive portion(s) 214-1, lower conductive portion 214-2, and metal feature 218 may each include a suitable conductive material such as copper, tungsten, or any other suitable material. For example, upper conductive portion(s) 214-1 and lower conductive portion 214-2 may include the same material such as copper. In some embodiments, dielectric layer 219 includes silicon oxide, silicon nitride, and/or silicon oxynitride.

Liner layer 207 may surround via structure 214 and electrically insulates via structure 214 from substrate 210, semiconductor layer 211, and interconnect structure 204. Liner layer 207 includes one or more first portions 207-1, a second portion 207-2 in contact with first portions 207-1, and a third portion 207-3 in contact with second portion 207-2. First portions 207-1 may each surround and be in contact with an upper conductive portion 214-1 in the z-direction. In some embodiments, first portion 207-1 each extends from between the corresponding upper conductive portion 214-1 and interconnect structure 204 to between the corresponding upper conductive portion 214-1 and semiconductor layer 211. Second portion 207-2 may surround and be in contact with the upper surface (e.g., a flat upper surface) of lower conductive portion 214-2 in the x-direction (e.g., in a plane parallel to a surface of substrate 210). In some embodiments, a lower surface of second portion 207-2 substantially levels with the upper surface of substrate 210 (or the interface between substrate 210 and semiconductor layer 211). In other words, second portion 207-2 may be disposed between semiconductor layer 211 and the upper surface of lower conductive portion 214-2. Third portion 207-3 may surround and be in contact with lower conductive portion 214-2 in the z-direction. In some embodiments, first portion 207-1 is regarded as a first liner layer that surrounds upper conductive portion 214-1, and second portion 207-2 and third portion 207-3 are together regarded as a second liner layer that surrounds lower conductive portion 214-2. The first liner layer may be in contact with the second liner layer.

Third portion 207-3 may have a thickness t along the x-direction. In some embodiments, the value of t is determined based on design requirements, such as the parasitic capacitance limit of via structure 214. In some embodiments, t is in a range from about 0.1 μm to about 5 μm, such as between about 2 μm to about 5 μm. In some embodiments, t is greater than the thickness of an existing liner layer, often in the range of about 1 μm to about 2 μm. In some embodiments, second portion 207-2 has substantially the same thickness as first portion 207-1. In some embodiments, the thickness of first portion 207-1 is less than t. In some embodiments, liner layer 207 includes silicon oxide, silicon nitride, and/or silicon oxynitride.

Substrate 210 may be a thinned substrate and may be formed from the thinning of an original substrate. Semiconductor layer 211 may be in contact with and over substrate 210. In some embodiments, a thickness of semiconductor layer 211, from the upper surface of semiconductor layer 211 to the interface face with substrate 210, may be in a range of about 0.1 μm to about 10 μm in the z-direction. As shown in FIG. 2C, the upper surface of semiconductor layer 211 may be lower than the upper surfaces of upper conductive portion(s) 214-1, and the lower surface of semiconductor layer 211 may substantially level with the upper surface of lower conductive portion 214-2. A die including a plurality of devices 215, such as transistors, capacitors, memory cells, interconnects, may be formed in and over semiconductor layer 211. Semiconductor layer 211 may include the same material as substrate 210, or have a different material as substrate 210. In some embodiments, substrate 210 may each include crystalline silicon, crystalline germanium, crystalline silicon germanium, and/or a III-V compound semiconductor such as GaAsP, AlInAs, AlGaAs, GaInAs, GaInP, GaInAsP, or the like. In some embodiments, semiconductor layer 211 is deposited over the substrate 210 using an epitaxial deposition process and may include polysilicon, amorphous silicon, crystalline silicon, germanium, silicon germanium, and/or a III-V compound semiconductor such as GaAsP, AlInAs, AlGaAs, GaInAs, GaInP, GaInAsP, or the like. In some embodiments, semiconductor layer 211 and substrate 210 each includes silicon.

Interconnect structure 204 may include MEOL contact features and BEOL interconnects. For example, interconnect structure 204 includes a plurality of gate contact vias, source/drain contacts, source/drain contact vias, and metallization layers. The metallization layers of interconnect structure 204 are embedded in a plurality of intermetal dielectric (IMD) layers that may be formed of low-k (LK) or extreme low-k (ELK) dielectric materials. Low-k dielectric materials refer to dielectric materials with a dielectric constant smaller than that of silicon dioxide, which is about 3.9. Example low-k dielectric materials may include Phosphosilicate Glass (PSG), Borosilicate Glass (BSG), Boron-Doped Phosphosilicate Glass (BPSG), Fluorine-Doped Silicate Glass (FSG), Tetraethyl orthosilicate (TEOS). ELK dielectric materials refer to dielectric materials with a dielectric constant smaller than 2.7. Example ELK dielectric materials include porous organosilicate glass. In some embodiments, the IMD layers may include one or more polyimide layers, one or more silicon nitride layer, one or more silicon oxide layers, or any combination. The metallization layers may include copper (Cu), aluminum (Al), or titanium nitride (TiN). In some embodiments, interconnect structure 204 includes a metal layer (e.g., metal layer 212) that is over and in contact with upper conductive portion(s) 214-1, and a contact layer (e.g., contact layer 217) in contact with connecting structure 202. The metal layer and the contact layer may be electrically connected by metallization layers (e.g., interconnects) in interconnect structure 204. In some embodiments, the contact layer may include aluminum (Al) or aluminum copper (Al—Cu) and may be referred to as an aluminum pad.

Connecting structure 202 may include a under bump metallization (UBM) layer and a solder feature over the UBM layer. The UBM layer is in contact with the contact layer, and may include multiple layers, such as a barrier layer, a seed layer and a metal bump. In some embodiments, the UBM layer may include titanium, titanium nitride, nickel, cupronickel, cobalt, copper, or a combination thereof. The solder feature may also be referred to as a solder bump. In some embodiments, the solder feature may include Pb—Sn, InSb, tin, silver, copper, or a combination thereof.

As shown in FIGS. 2B and 2C, devices 215 may be formed around upper conductive portions 214-1. Because lower conductive portion 214-2 is formed in substrate 210, and is completely below devices 215, the size and the location of lower conductive portion 214-2 has little impact on the locations/arrangement of devices 215. The locations/arrangement of devices 215 are thus not limited by lower conductive portion 214-2. In some embodiments, the projection of devices 215 may partially or fully overlap with the projection of lower conductive portion 214-2 on a plane parallel to the surface of substrate 210 (e.g., the x-y plane). For example, one or more devices 215 may be formed between two adjacent upper conductive portions 214-1. In some embodiments, devices 215 may include FEOL devices. In some embodiments, devices 215 may include FEOL devices, MEOL devices, and/or BEOL devices.

FIGS. 3A-3F illustrate the top views of a plurality of exemplary via structures, according to embodiments of the present disclosure. Each of the via structures has a different arrangement of upper conductive portion(s). Corresponding devices (e.g., FEOL devices, MEOL structures, and BEOL structures) are disposed around the upper conductive portions. For example, as shown in FIGS. 3A-3F, a via structure may include a single upper conductive portion 303 (e.g., FIG. 3A), two upper conductive portions 303 (e.g., FIG. 3B), three upper conductive portions 303 (e.g., FIGS. 3C, 3D), and four upper conductive portions 303 (e.g., FIGS. 3E, 3F). The projections of one or more devices 304 (e.g., FEOL devices, MEOL structures, and BEOL structures) may partially or fully overlap with the projection of lower conductive portion 302. In some embodiments, the projections of upper conductive portions 303 may form a symmetric pattern (e.g., FIGS. 3B-3F). For example, the projections of upper conductive portions 303 may be symmetric about a geographic center of lower conductive portion 302 (e.g., FIGS. 3B-3F) on a plane parallel to a surface of the corresponding substrate (e.g., 210). In some embodiments, devices 304 are formed between adjacent upper conductive portions 303 and away from upper conductive portions 303.

A method 400 for forming a semiconductor structure having a via structure (e.g., a multi-level via structure) is illustrated in the flowchart in FIGS. 4A and 4B. FIG. 4B is a continuation of FIG. 4A. Method 400 is merely an example, and is not intended to limit the present disclosure beyond what is explicitly recited in the claims. FIGS. 5A-5L illustrate cross-sectional views of part of the semiconductor structure at different stages of a fabrication process, according to some aspects of the present disclosure. Additional operations can be provided before, during, and after the method 400, and some operations described can be replaced, eliminated, or moved around for additional embodiments of method 400. Method 400 may be employed to form the via structures illustrated in FIGS. 2C and 3A-3F, and will be described in more detail below.

As shown in FIG. 4A, method 400 includes a block 402 where a first opening is formed in a substrate on a first surface of the substrate. FIG. 5A illustrates a corresponding structure.

As shown in FIG. 5A, a first opening 503 is formed in a substrate 502 on the first surface of substrate 502. In an example process, the first opening 503 is formed using an anisotropic dry etch process, such as reactive ion etching (RIE). First opening 503 has a diameter (e.g., diameter d3) along the x-direction. Diameter d3 is sufficiently large to encompass a lower conductive portion and a liner layer to be formed within. For example, d3 may be in the range of about 1 μm to about 50 μm. A depth of first opening 503 (e.g., along the z-direction) may be substantially the same as the depth of the lower conductive portion, and may be in the range of about 1 μm to about 200 μm. The formation of first opening 503 may include a suitable patterning process, e.g., photolithography and etching process (e.g., dry etch and/or wet etch). Substrate 502 may include, for example, bulk silicon, doped or undoped, and/or an active layer of a semiconductor-on-insulator (SOI) substrate. A SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, substrate 502 may include another elementary semiconductor (e.g., germanium), a compound semiconductor (e.g., silicon carbide, gallium arsenic, gallium phosphide, indium phosphide, indium arsenide, and/or indium antimonide), an alloy semiconductor (e.g., SiGe, GaAsP, AlInAs, AlGaAs, GaInAs, GaInP, and/or GaInAsP), or combinations thereof. Other substrates, such as multi-layered or gradient substrates, may also be used.

Figure 5B:
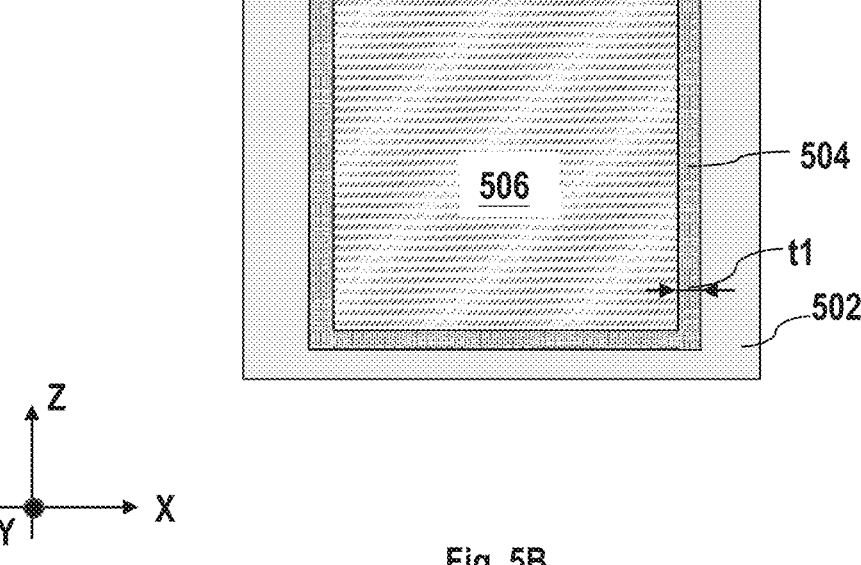

Referring back to FIG. 4A, method 400 includes a block 404 where a first layer of a liner material and a sacrificial structure are deposited into the first opening. FIG. 5B illustrate a corresponding structure.

As shown in FIG. 5B, a first layer 504 of a liner material and a sacrificial structure 506 are deposited into first opening 503. First layer 504 of the liner material may be conformally deposited into first opening 503, and a sacrificial material may be deposited over the liner material and fill first opening 503. The deposited sacrificial material may form sacrificial structure 506. First layer 504 of the liner material may cover the side surface and the lower surface of first opening 503. A thickness t1 of first layer 504 of the liner material may be substantially the same as thickness t (e.g., referring to semiconductor structure 201 in FIG. 2C). The liner material includes a suitable dielectric material such as silicon oxide. The sacrificial material is different from the liner material such that the liner material and the sacrificial material have different etching selectivities. In the etching process to remove sacrificial structure 506, an etchant can have a much higher etch rate on the sacrificial material than on the liner material. In some embodiments, in the etching process, sacrificial structure 506 may be removed sufficiently fast to minimize damage the liner material. In some embodiments, the liner material includes silicon oxide, and the sacrificial material includes one or more of silicon nitride, polysilicon, carbon, silicon germanium, germanium, etc. In some embodiments, the depositions of first layer 504 of the liner material and sacrificial structure 506 include atomic layer deposition (ALD), chemical vapor deposition (CVD), physical vapor deposition (PVD), a combination thereof, or the like.

In some embodiments, a planarization process is performed to remove excess sacrificial material and liner material on the first surface of substrate 502. The upper surfaces of sacrificial structure 506 and first layer 504 of liner material may be coplanar with the first surface of substrate 502. For example, sacrificial structure 506 has a substantially flat upper surface. In some embodiments, the planarization process includes a chemical mechanical polishing (CMP) and/or a suitable recess etch.

Figure 5C:
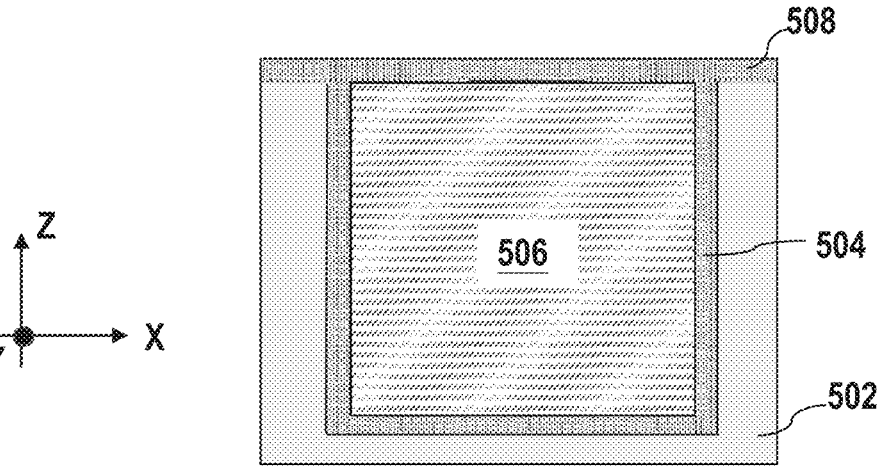

Referring back to FIG. 4A, method 400 includes a block 406 where a second layer of the liner material is deposited and patterned over the sacrificial structure. FIG. 5C illustrates a corresponding structure.

As shown in FIG. 5C, a second layer 508 of the liner material may be deposited over and in contact with sacrificial structure 506, first layer 504 of the liner material, and the first surface of substrate 502. The deposition of the second layer 508 of the liner material may include ALD, CVD, PVD, a combination thereof, or the like.

Figure 5D:
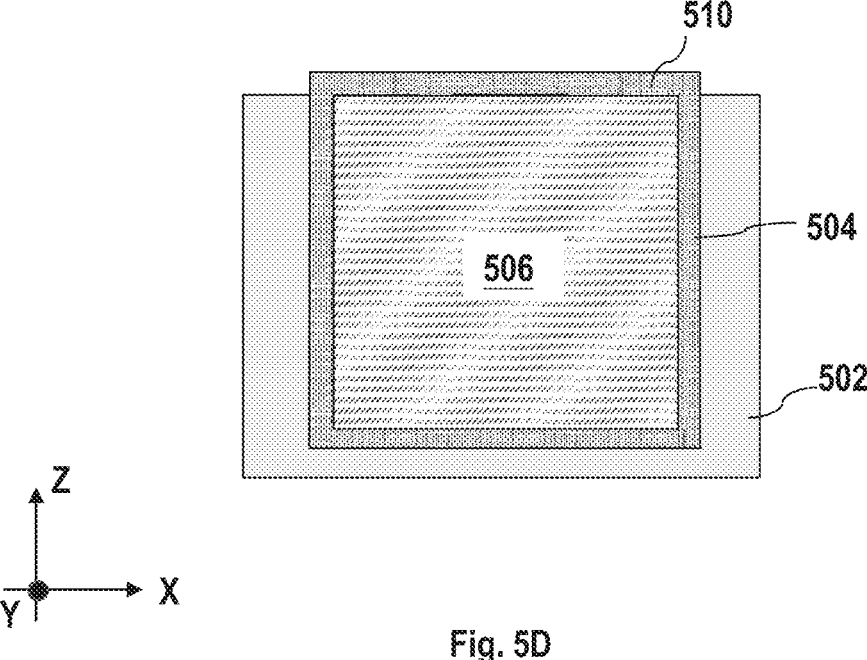

As shown in FIG. 5D, a patterned second layer 510 of the liner material may be formed over sacrificial structure 506 and first layer 504 of the liner material. A suitable patterning process may be performed to pattern second layer 508 of the liner material to remove a portion of the liner material over substrate 502. Patterned second layer 510 of the liner material may be in contact with sacrificial structure 506 and first layer 504 of the liner material. The patterning process may include photolithography and an etching process (e.g., dry etch and/or wet etch). Operations shown in FIG. 5D expose top-facing surfaces of the substrate 502, which aids the subsequent formation of a semiconductor layer 512 (to be described further below)

Referring back to FIG. 4A, method 400 includes a block 408 where a semiconductor layer is formed over the first surface of the substrate. FIG. 5E illustrates a corresponding structure.

As shown in FIG. 5E, a semiconductor layer 512 is deposited over the first surface of substrate 502. Semiconductor layer 512 may be over and in contact with patterned second layer 510 of the liner material and substrate 502. In some embodiments, the interface between semiconductor layer 512 and substrate 502 may level with the upper surface (e.g., a flat upper surface) of sacrificial structure 506. The upper surface of semiconductor layer 512 may be over the upper surface of patterned second layer 510 of the liner material. In some embodiments, a thickness of semiconductor layer 512, from its upper surface to the interface face with substrate 502, may be in a range of about 0.1 µm to about 10 µm. Semiconductor layer 512 may include a suitable semiconductor material such as silicon. In one embodiment, the semiconductor layer 512 and the substrate 502 share the same semiconductor composition. In some embodiments, the semiconductor layer 512 is epitaxially deposited using vapor phase epitaxy (VPE), molecular beam epitaxy (MBE), or CVD over the patterned second layer 510 and the exposed surfaces of the substrate 202. Optionally, a planarization process is performed to remove excess semiconductor material such that semiconductor layer 512 has a flat upper surface. The planarization process may include CMP and/or a suitable recess etch.

Referring back to FIG. 4A, method 400 includes a block 410 where a FEOL device is formed in the semiconductor layer. FIG. 5F illustrates a corresponding structure.

As shown in FIG. 5F, a FEOL device 514-1 is formed in semiconductor layer 512. FEOL device 514-1 may be disposed partially or fully in semiconductor layer 512. FEOL device 514-1 may include various structures/devices such as logic devices, memory cells, etc. The formation of FEOL device 514-1 may include photolithography, etching, depositions, doping, planarization, a combination thereof, or the like.

Referring back to FIG. 4A, method 400 includes a block 412 where a partial interconnect structure is formed over the semiconductor layer. FIG. 5F illustrates a corresponding structure.

As shown in FIG. 5F, a partial interconnect structure 516 (e.g., part of an interconnect structure) is formed over and in contact with semiconductor layer 512. Partial interconnect structure 516 may include a plurality of IMD layers and conductive features such as contact vias, electrodes, and metallization layers. In some embodiments, the interconnect structure includes various MEOL and BEOL structures/devices such as source/drain contacts, interconnects, vias, etc. In some embodiments, the MEOL and BEOL structures/devices may also be referred to as MEOL/BEOL device 514-2, and may be formed over FEOL device 514-1. The formation of partial interconnect structure 516 may include photolithography, etching, depositions, doping, planarization, plating, a combination thereof, or the like. In some embodiments, as shown in FIG. 5F, FEOL device 514-1 and MEOL/BEOL device 514-2 may be disposed in areas of which the projections partially or fully overlap with the projection of sacrificial structure 506 on a plane parallel to a surface of substrate 502 (e.g., the x-y plane), referring to the description of FIGS. 3A-3F. FEOL device 514-1 and MEOL/BEOL device 514-2 may together be referred to as device 514 in the following figures.

Referring back to FIG. 4B, method 400 includes a block 414 where a second opening is formed through the interconnect structure and the semiconductor layer, and in contact with the sacrificial structure. FIG. 5G illustrates a corresponding structure.

As shown in FIG. 5G, one or more second openings 518 are formed through partial interconnect structure 516 and semiconductor layer 512, and in contact with sacrificial structure 506. The bottom of second opening 518 may expose sacrificial structure 506. In some embodiments, a plurality of second openings 518 are formed extending in parallel in the z-direction. In some embodiments, a width of second opening 518 (e.g., in the x-direction) is in a range of about 0.1 µm to about 5 µm, and a depth of second opening 518 (e.g., in the z-direction) is in a range of about 1 µm to about 15 µm. The formation of second opening(s) 518 may include a suitable patterning process that includes photolithography and an etching process (e.g., dry etch and/or wet etch).

Referring back to FIG. 4B, method 400 includes a block 416 where a third layer of the liner material is deposited in the second opening(s) and in contact with the patterned second layer of the liner material. FIG. 5G illustrates a corresponding structure.

As shown in FIG. 5G, a third layer of the liner material is deposited in second opening 518 and in contact with patterned second layer 510 of the liner material. The third layer of the liner material may be over and in contact with the side surface of second opening 518. The deposition of third layer of the liner material may include ALD, CVD, PVD, a combination thereof, or the like. A recess etch (e.g., dry and/or wet etching process) may be performed to remove a portion of the liner material at the bottom of each second opening 518 to expose sacrificial structure 506. A liner structure 520 may be formed. As shown in FIG. 5G, liner structure 520 may include one or more first portions 520-1, a second portion 520-2 in contact with first portion 520-1, a third portion 520-3 in contact with second portion 560-2, and a fourth portion 520-4 in contact with third portion 520-3. Specifically, first portion 520-1 includes the layer of the liner material over and in contact with the side surface of second opening 518, second portion 520-2 includes the layer of the liner material in contact with the upper surface of sacrificial structure 506, third portion 520-3 includes the layer of the liner material in contact with the side surface of sacrificial structure 506, and fourth portion 520-4 includes the layer of the liner material in contact with the lower surface of sacrificial structure 506. In some embodiments, first portion 520-1 and third portion 520-3 may extend in the z-direction, and second portion 520-2 and fourth portion 520-4 may extend in the x-direction (e.g., in the x-y plane).

Referring back to FIG. 4B, method 400 includes a block 418 where a first conductive portion is formed in each second opening and in contact with the sacrificial structure. FIG. 5H illustrates a corresponding structure.

As shown in FIG. 5H, a first conductive portion 522 is formed to fill each second opening 518. First conductive portion 522 may include a suitable conductive material such as copper. In some embodiments, first conductive portion 522 may include multiple layers, such as a barrier layer, a seed layer, and a metal filling layer. In some embodiments, first conductive portion 522 includes titanium, titanium nitride, nickel, cupronickel, cobalt, copper, or a combination thereof. First conductive portion 522 may be formed by CVD, PVD, plating, a combination thereof, or the like. First conductive portion 522 may each be in contact with sacrificial structure 506. Optionally, a planarization process is performed to remove excess conductive material. The planarization process may include a CMP and/or a suitable recess etch.

Figures 5I, 5J:
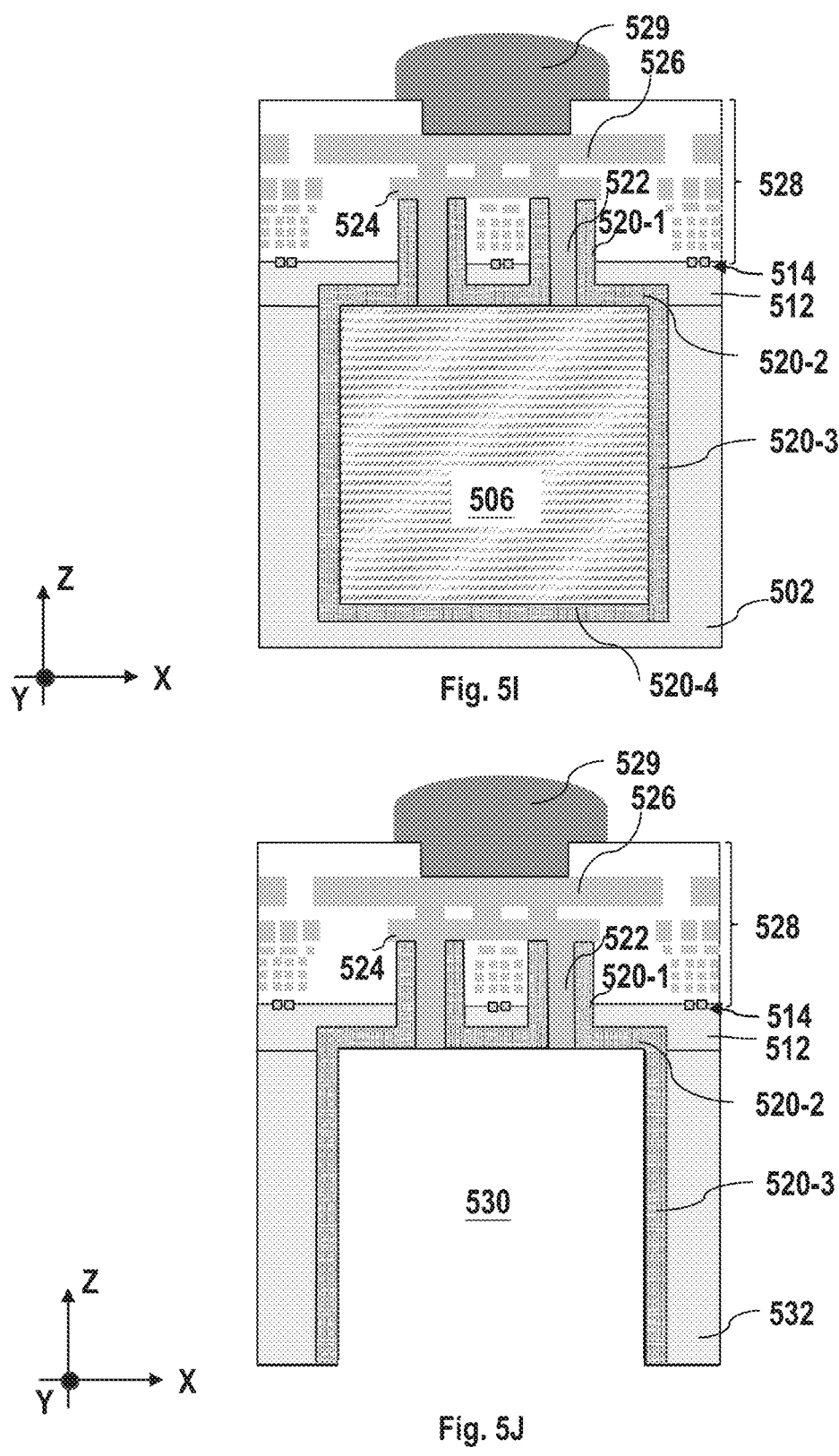

Referring back to FIG. 4B, method 400 includes a block 420 where the rest of the interconnect structure is formed. FIG. 5I illustrates a corresponding structure.

As shown in FIG. 5I, the rest of the interconnect structure is formed over partial interconnect structure 516 to form the entire interconnect structure, represented by element 528. In some embodiments, the rest of the interconnect structure includes IMD layers and various BEOL structures/devices such as metallization layers, vias, top metal layers etc. For example, the rest of interconnect structure 528 may include a metal layer 524 (e.g., referring back to metal layer 212) formed over and in contact with first conductive portions 522 and a contact layer 526 (e.g., referring back to contact layer 217) over metal layer 524. Metal layer 524 and contact layer 526 may be electrically connected by vias and/or metallization layers. Interconnect structure 528 may include a dielectric material and a conductive material, such as silicon oxide and copper. In some embodiments, a connecting structure 529, including a UBM layer and a soldering feature, is formed over interconnect structure 528. Connecting structure 529 may include suitable metals such as titanium and copper. The formation of the rest of interconnect structure 528 may include photolithography, etching, depositions, doping, planarization, plating, soldering, a combination thereof, or the like.

Referring back to FIG. 4B, method 400 includes a block 422 where the sacrificial structure is removed from a second surface of the substrate to expose the first conductive portion(s) and form a third opening. FIG. 5J illustrates a corresponding structure.

As shown in FIG. 5J, sacrificial structure 506 may be removed from a second surface (e.g., opposite surface of the first surface) of substrate 502 to expose first conductive portion(s) 522 and form a third opening 530. In some embodiments, before removing sacrificial structure 506, substrate 502 may be thinned from the second surface, and fourth portion 520-4 of the liner material may be removed from the second surface of substrate 502. A thinned substrate 532 (e.g., substrate 210) may be formed, and third opening 530 may be formed by the removal of sacrificial structure 506 and fourth portion 520-4 of the liner material. Third opening 530 may expose first conductive portion(s) 522, second portion 520-2 of the liner material, and third portion 520-3 of the liner material. In some embodiments, first portion 520-1, second portion 520-2, and third portion 520-3 may form a liner layer (e.g., liner layer 207). In some embodiments, the thinning of substrate 502 includes a suitable etching process and/or a planarization process. The etching process includes a dry etch and/or a wet etch. The planarization process may include a CMP. The removal of sacrificial structure 506 may include a suitable etching process such as a dry etch and/or a wet etch. In some embodiments, the etchant to remove sacrificial structure 506 has a much higher etch rate on sacrificial structure 506 than on the liner material. For example, the etch rate of sacrificial structure 506 may be at least five times higher than that of the liner material. In one embodiment, the sacrificial structure 506 includes silicon germanium and may be selectively removed using a suitable wet etch process.

Referring back to FIG. 4B, method 400 includes a block 424 where a second conductive portion is formed in the third opening. FIG. 5K illustrates a corresponding structure.

As shown in FIG. 5K, a second conductive portion 534 is formed in third opening 530. The same conductive material for forming first conductive portion(s) 522 may be deposited to fill third opening 530. In some embodiments, second conductive portion 534 may include multiple layers, such as a barrier layer, a seed layer, and a metal filling layer. In some embodiments, second conductive portion 534 includes titanium, titanium nitride, nickel, cupronickel, cobalt, copper, or a combination thereof. In some embodiments, first conductive portion(s) 522 and second conductive portion 534 include copper. Second conductive portion 534 may be formed by CVD, PVD, plating, a combination thereof, or the like. Optionally, a planarization process is performed to remove excess conductive material. The planarization process may include a CMP and/or a suitable recess etch.

Referring back to FIG. 4B, method 400 includes a block 426 where a bonding layer is formed over the second conductive portion and the thinned substrate. FIG. 5L illustrates a corresponding structure.

As shown in FIG. 5L, a bonding layer, including a dielectric layer 536, and a metal feature 538 in dielectric layer 536, may be formed over second conductive portion 534 and thinned substrate 532. In some embodiments, a layer of dielectric material is deposited over thinned substrate 532 (e.g., the second surface of substrate 502). The layer of dielectric material is patterned to form a recess that exposes second conductive portion 534 and the liner layer. A conductive material is deposited into the recess, forming metal feature 538. Dielectric layer 536 and metal feature 538 may be formed by ALD, CVD, PVD, plating, a combination thereof, or the like. Optionally, a planarization process is performed to remove excess conductive material. The planarization process may include a CMP and/or a suitable recess etch.

In one embodiment of the present disclosure, a via structure includes a first conductive portion through an interconnect structure, a second conductive portion through a substrate and in contact with the first conductive portion, and a liner layer between the first conductive portion and the interconnect structure, and between the second conductive portion and the substrate. The liner layer includes a portion extending parallel to a surface of the substrate. In some embodiments, the first conductive portion further extends through a semiconductor layer between the interconnect structure and the substrate, and the portion of the liner layer extends between the second conductive portion and the semiconductor layer. In some embodiments, a diameter of the first conductive portion is smaller than a diameter of the second conductive portion. In some embodiments, the first conductive portion and the second conductive portion each extends in a direction perpendicular to the surface of the substrate. On a plane parallel to the surface of the substrate, a projection of the first conductive portion may be within a projection of the second conductive portion.

In some embodiments, an interface between the first conductive portion and the second conductive portion levels with an interface between the substrate and the semiconductor layer. In some embodiments, the liner layer includes another portion extending perpendicular to the surface of the substrate, and a thickness of the other portion of the liner layer is in a range of about 0.1 µm to about 5 µm. In some embodiments, along a direction parallel to the surface of the substrate, the diameter of the first conductive portion is in a range of about 50 nm to about 5 µm. Along the direction parallel to the surface of the substrate, the diameter of the second conductive portion may be in a range of about 1 μm to about 100 μm. In some embodiments, the liner layer includes silicon oxide.

In another embodiment of the present disclosure, a semiconductor structure includes a substrate, a semiconductor layer over the substrate, an interconnect structure over the semiconductor layer, and a via structure through the substrate, semiconductor layer, and the interconnect structure. The semiconductor structure also includes a transistor in the semiconductor layer. The via structure may include a first conductive portion through the interconnect structure and the semiconductor layer, and a second conductive portion in contact with the first conductive portion and through the substrate. The transistor may be disposed directly over a top surface (e.g., a flat top surface) of the second conductive portion. In some embodiments, the first conductive portion and the second conductive portion are cylindrical in shape, and a diameter of the first conductive portion is smaller than a diameter of the second conductive portion. In some embodiments, the first conductive portion and the second conductive portion each extends in a direction perpendicular to a surface of the substrate, and on the plane parallel to the surface of the substrate, a projection of the first conductive portion is within the projection of the second conductive portion.

In some embodiments, the semiconductor structure further includes a first liner layer between the second conductive portion and the substrate. The first liner layer may include a portion disposed between the top surface of the second conductive portion and the semiconductor layer. In some embodiments, the semiconductor structure further includes a second liner layer extending from between the first conductive portion and the interconnect structure to between the first conductive portion and the semiconductor layer. The second liner layer is in contact with the first liner layer. In some embodiments, the first liner layer includes a sidewall portion disposed between a sidewall of the second conductive portion and the substrate, and a thickness of the sidewall portion is greater than a thickness of the second liner layer. In some embodiments, the semiconductor structure further includes a third conductive portion through the interconnect structure and in contact with the second conductive portion. A die structure may be disposed between the second conductive portion and the third conductive portion. In some embodiments, on the plane parallel to a surface of the substrate, a projection of the first conductive portion and a projection of the third conductive portion are symmetric about a geographic center of the second conductive portion.

In yet another embodiment of the present disclosure, a method for forming a semiconductor structure includes forming a sacrificial structure in a substrate, forming a semiconductor layer over the sacrificial structure and the substrate, forming an opening through the semiconductor layer to expose the sacrificial structure, forming a first conductive portion in the opening and in contact with the sacrificial structure, and replacing the sacrificial structure with a second conductive portion. In some embodiments, the method further includes forming an interconnect layer over the semiconductor layer prior to the forming of the opening. The forming of the opening includes removing a portion of each of the semiconductor layer and the interconnect layer such that the opening is through the semiconductor layer and the interconnect layer. In some embodiments, the replacing of the sacrificial structure includes removing the sacrificial structure to form a second opening that exposes the first conductive portion, and depositing a conductive material in the second opening. In some embodiments, the forming of the semiconductor layer includes depositing the semiconductor layer over a first surface of the substrate, and the removing of the sacrificial structure includes etching the sacrificial structure from a second surface of the substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A via structure, comprising:
a first conductive portion through an interconnect structure;
a second conductive portion through a substrate and in contact with the first conductive portion;
a third conductive portion through the interconnect structure and in contact with the second conductive portion; and
a liner layer between the first conductive portion and the interconnect structure, and between the second conductive portion and the substrate,
wherein the liner layer comprises a portion extending parallel to a surface of the substrate.

2. The via structure of claim 1,
wherein the first conductive portion further extends through a semiconductor layer between the interconnect structure and the substrate, and
wherein the portion of the liner layer extends between the second conductive portion and the semiconductor layer.

3. The via structure of claim 2, wherein an interface between the first conductive portion and the second conductive portion levels with an interface between the substrate and the semiconductor layer.

4. The via structure of claim 1, wherein a diameter of the first conductive portion is smaller than a diameter of the second conductive portion.

5. The via structure of claim 4,
wherein, along a direction parallel to the surface of the substrate, the diameter of the first conductive portion is in a range of about 50 nm to about 5 μm, and
wherein, along the direction parallel to the surface of the substrate, the diameter of the second conductive portion is in a range of about 1 μm to about 100 μm.

6. The via structure of claim 1,
wherein the first conductive portion and the second conductive portion each extends in a direction perpendicular to the surface of the substrate, and
wherein, on a plane parallel to the surface of the substrate, a projection of the first conductive portion is within a projection of the second conductive portion.

7. The via structure of claim 1,
wherein the portion is a first portion,
wherein the liner layer further comprises a second portion extending perpendicular to the surface of the substrate, and
wherein a thickness of the second portion of the liner layer is in a range of about 0.1 μm to about 5 μm.

8. The via structure of claim 1, wherein the liner layer comprises silicon oxide.

9. The via structure of claim 1, wherein the portion of the liner layer extends laterally between a sidewall of the first conductive portion and a sidewall of the third conductive portion.

10. A semiconductor structure, comprising:

a substrate;

a semiconductor layer over the substrate;

an interconnect structure over the semiconductor layer;

a via structure through the substrate, semiconductor layer, and the interconnect structure; and a transistor in the semiconductor layer, wherein the via structure comprises:

a first conductive portion through the interconnect structure and the semiconductor layer, a second conductive portion in contact with the first conductive portion and through the substrate, and a third conductive portion in contact with the second conductive portion, wherein the transistor is disposed directly over the second conductive portion, and wherein the third conductive portion extends alongside the first conductive portion through the interconnect structure.

11. The semiconductor structure of claim 10, wherein the first conductive portion and the second conductive portion are cylindrical in shape, and wherein a diameter of the first conductive portion is smaller than a diameter of the second conductive portion.

12. The semiconductor structure of claim 10, wherein the first conductive portion and the second conductive portion each extend in a direction perpendicular to a surface of the substrate, and wherein, on a plane parallel to the surface of the substrate, a projection of the first conductive portion is within the projection of the second conductive portion.

13. The semiconductor structure of claim 10, further comprising:

a first liner layer between the second conductive portion and the substrate, wherein the first liner layer comprises a portion disposed between the top surface of the second conductive portion and the semiconductor layer.

14. The semiconductor structure of claim 13, further comprising:

a second liner layer extending from between the first conductive portion and the interconnect structure to between the first conductive portion and the semiconductor layer, wherein the second liner layer is in contact with the first liner layer.

15. The semiconductor structure of claim 14, wherein the first liner layer comprises a sidewall portion disposed between a sidewall of the second conductive portion and the substrate, and wherein a thickness of the sidewall portion is greater than a thickness of the second liner layer.

16. The semiconductor structure of claim 10, further comprising a die structure is disposed between the second conductive portion and the third conductive portion.

17. The semiconductor structure of claim 10, wherein, on a plane parallel to a surface of the substrate, a projection of the first conductive portion and a projection of the third conductive portion are symmetric about a geographic center of the second conductive portion.

18. A semiconductor structure, comprising:

a substrate;

a semiconductor layer overlaying the substrate;

an interconnect structure overlaying the semiconductor layer; and a via structure, comprising:

a first upper portion and a second upper portion extending through the semiconductor layer and the interconnect structure, wherein the first upper portion and the second upper portion are separated along a lateral direction, a lower portion extending through the substrate and coupled to the first upper portion and the second upper portion, and a liner extending along a sidewall of the lower portion and a sidewall of one of the first upper portion and the second upper portion.

19. The semiconductor structure of claim 18, wherein the liner extends along portions of a top surface of the lower portion.

20. The semiconductor structure of claim 18, wherein the semiconductor structure further comprises a transistor disposed over the semiconductor layer, and wherein the transistor is interposed between the first upper portion and the second upper portion along the lateral direction.

* * * * *